United States Patent
Ripp et al.

(10) Patent No.: US 9,696,343 B2
(45) Date of Patent: Jul. 4, 2017

(54) ASSET MANAGEMENT SYSTEM FOR HF SENSITIVE MEASUREMENT DEVICES

(71) Applicant: Rohde & Schwarz GmbH & Co. KG, München (DE)

(72) Inventors: Harald Ripp, München (DE); Hans-Joachim Mann, Neubiberg (DE); Michael Winkler, Winzer (DE)

(73) Assignee: ROHDE & SCHWARZ GMBH & CO. KG, München (DE)

( * ) Notice: Subject to any disclaimer, the term of this patent is extended or adjusted under 35 U.S.C. 154(b) by 61 days.

(21) Appl. No.: 14/341,031

(22) Filed: Jul. 25, 2014

(65) Prior Publication Data
US 2016/0025784 A1   Jan. 28, 2016

(51) Int. Cl.
| | |
|---|---|
| H01H 31/02 | (2006.01) |
| G01R 1/04 | (2006.01) |
| G01R 1/18 | (2006.01) |
| G06Q 10/08 | (2012.01) |
| G06Q 50/04 | (2012.01) |
| G01R 31/319 | (2006.01) |

(52) U.S. Cl.
CPC .......... G01R 1/04 (2013.01); G01R 1/18 (2013.01); G06Q 10/087 (2013.01); G06Q 50/04 (2013.01); G01R 31/31907 (2013.01)

(58) Field of Classification Search
CPC ...... G01R 23/02; G01R 1/04; G01R 31/2805; G01R 31/024; G01R 31/021; G01R 31/026; G01R 7/06; G01R 5/04; G01R 1/18; G01R 1/07342; G01R 1/2886; H04B 17/101; H04B 17/11; G01P 1/06

USPC .............. 324/555, 144, 750.26, 750.27, 537
See application file for complete search history.

(56) References Cited

U.S. PATENT DOCUMENTS

| | | | | |
|---|---|---|---|---|
| 7,248,933 | B2 * | 7/2007 | Wildman | G06F 19/327 700/115 |
| 7,317,377 | B2 * | 1/2008 | Galperin | G06K 19/0723 340/5.64 |
| 7,605,699 | B2 * | 10/2009 | Tanaka | G01S 13/74 235/375 |
| 7,934,660 | B2 * | 5/2011 | Yeakley | G06F 17/2247 235/462.01 |
| 8,395,506 | B2 * | 3/2013 | Elledge | G06F 21/88 235/375 |
| 8,954,292 | B2 | 2/2015 | Troxler | |
| 9,173,066 | B1 * | 10/2015 | Jain | H04W 4/027 |
| 2006/0074513 | A1 * | 4/2006 | DeRose | G07C 3/00 700/175 |
| 2008/0129459 | A1 * | 6/2008 | Bailly | H04L 67/125 340/10.1 |
| 2009/0207027 | A1 * | 8/2009 | Banerjee | G06K 19/07771 340/572.7 |

(Continued)

*Primary Examiner* — Thang Le
(74) *Attorney, Agent, or Firm* — Jenkins, Wilson, Taylor & Hunt, P.A.

(57) ABSTRACT

An asset management system comprising an asset management server connected to a plurality of distributed HF sensitive measurement devices each having at least one inseparable asset tag being located outside a high frequency shield which shields an internal circuitry of the measurement device from external high frequency signals and being configured to provide asset data of the respective measurement device to be processed by the asset management server.

21 Claims, 13 Drawing Sheets

(56) References Cited

U.S. PATENT DOCUMENTS

| | | | |
|---|---|---|---|
| 2010/0127828 A1* | 5/2010 | Connolly | G06K 7/0008 340/10.1 |
| 2013/0215467 A1* | 8/2013 | Fein | G06F 3/1204 358/1.15 |
| 2013/0308229 A1* | 11/2013 | Faxvog | H02H 7/04 361/35 |

* cited by examiner

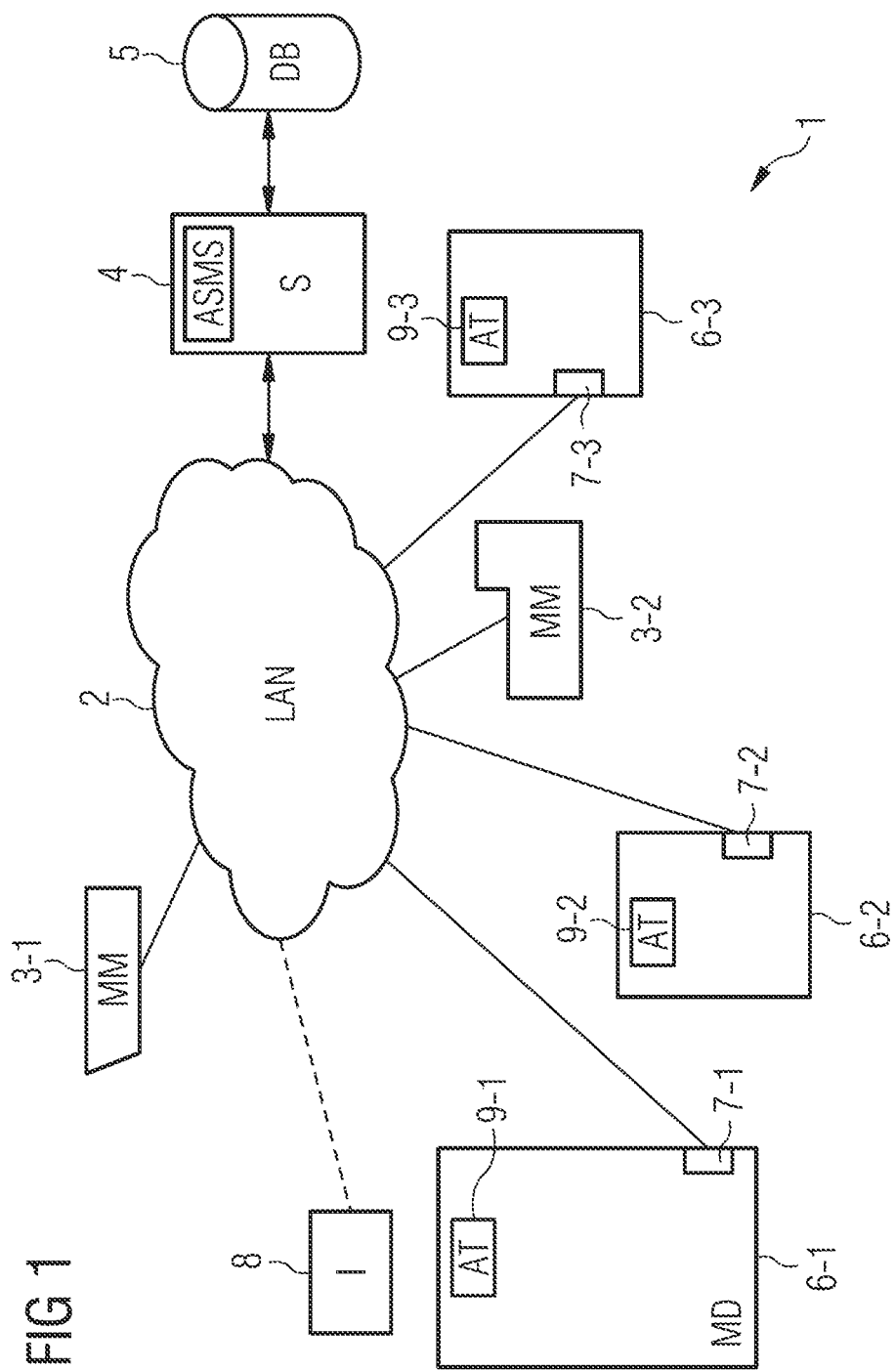

ASSET MANAGEMENT SYSTEM FOR HF SENSITIVE MEASUREMENT DEVICES

FIELD OF THE INVENTION

The present invention relates to an asset management system comprising HF sensitive measurement devices and a mobile asset management interrogator and to a measurement device rack comprising stacked measurement devices with integrated asset tags as well as to a method for providing asset data of a plurality of distributed measurement devices of a facility.

BACKGROUND OF THE INVENTION

Measurement devices—also denoted as measuring instruments or measuring apparatus—are used to measure physical parameters or signals. Measurement devices, in particular high frequency measurement devices, include a measurement circuitry which is sensitive to high frequency electromagnetic waves. Such kinds of measurement devices can be used in a facility such as production facility or a laboratory to perform measurements. Measurement devices include a variety of different types of measurement devices such as oscilloscopes, signal generators, signal analyzers, network analyzers or testing devices. In a facility such as a production facility, a plurality of measuring devices can be used to provide signals for controlling the production process. Most measurement devices require recalibration of components due to aging and/or environmental influences such as humidity or high and varying temperature. In a conventional facility comprising a plurality of different measurement devices of different types and different operation lifetimes, it is difficult to keep track of the measurement device inventory within the facility and specific requirements of the different measurement devices such as a necessary recalibration of the measurement devices.

Consequently, there is a need to provide a comfortable, but nevertheless fail-safe asset management system for measurement devices used in a facility.

SUMMARY OF THE INVENTION

The present invention provides a method and a system for providing asset data of a plurality of distributed measurement devices, a high frequency sensitive measurement device with an integrated asset tag and an asset management system comprising a mobile asset management interrogator.

Specifically, according to a first aspect of the present invention, a high frequency sensitive measurement device is provided comprising a measurement circuitry with a surrounding high frequency shield adapted to shield the measurement circuitry from external high frequency interference signals, wherein said measurement device comprises at least one inseparable asset tag located outside the high frequency shield, said asset tag being configured to communicate with an external interrogator of an asset management system.

According to a second aspect of the present invention, a mobile asset management interrogator is provided, said interrogator being switchable between at least two operation modes, wherein the asset management interrogator is configured to read in a first operation mode first asset data from long range asset tags attached to distributed measurement devices and is configured to read in a second operation mode second asset data from short range asset tags attached to the distributed measurement devices.

According to a third aspect of the present invention, a measurement device rack is provided comprising stacked measurement devices each having a measurement circuitry with a surrounding high frequency shield to protect the measurement circuitry from external high frequency interference signals, wherein each measurement device comprises at least one inseparable asset tag located outside its high frequency shield.

According to a fourth aspect of the present invention, a method for providing asset data of a plurality of distributed high frequency sensitive measurement devices is provided comprising reading asset data from inseparable asset tags of monitored measurement devices, said asset tag being located outside a high frequency shield protecting an internal measurement circuitry of the respective measurement device from external high frequency interference signals, and processing the read asset data by an asset management server to perform asset management of the distributed measurement devices.

According to a fifth aspect of the present invention, a computer readable program product is provided, the computer readable program product comprising instructions which, when executed on a programmable circuit of a computer, cause the programmable circuit to be operated to provide asset data of a plurality of distributed high frequency sensitive measurement devices comprising reading asset data from inseparable asset tags of monitored measurement devices, wherein said asset tag is located outside a high frequency shield protecting an internal measuring circuitry of the respective measurement device from external high frequency interference signals, and processing the read asset data by an asset management server to perform asset management of the distributed measurement devices. In one embodiment, the computer readable program product includes one or more non-transitory computer readable media on which the instructions are stored.

With the asset management system according to the present invention, it is possible to keep track of the different requirements of a plurality of distributed measurement devices within a facility. The asset management system not only allows to perform an inventory monitoring of the distributed measurement devices, but also to perform necessary actions required by the different distributed measurement devices, such as recalibration or calibration of the measurement devices. The asset management system is adapted to facilitate the search of specific distributed measurement devices within the facility by using different kinds of asset tags with different ranges. The asset management system according to the present invention further increases security against theft of measurement devices by using specific hidden antitheft asset tags with medium signal range.

Specific embodiments of the present invention are set forth in the dependent claims.

These and other aspects of the present invention will be apparent from and elucidated with reference to the embodiments described hereinafter.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments of the different aspects of the present invention which are specified in the schematic figures of the drawings in which:

FIG. 1 shows a schematic diagram of an asset management system according to an aspect of the present invention;

In the figures of the drawings, elements, features and signals which are the same or at least have the same functionality have been provided with the same reference symbols, unless explicitly stated otherwise.

DETAILED DESCRIPTION OF THE EMBODIMENTS

Figure 2A:
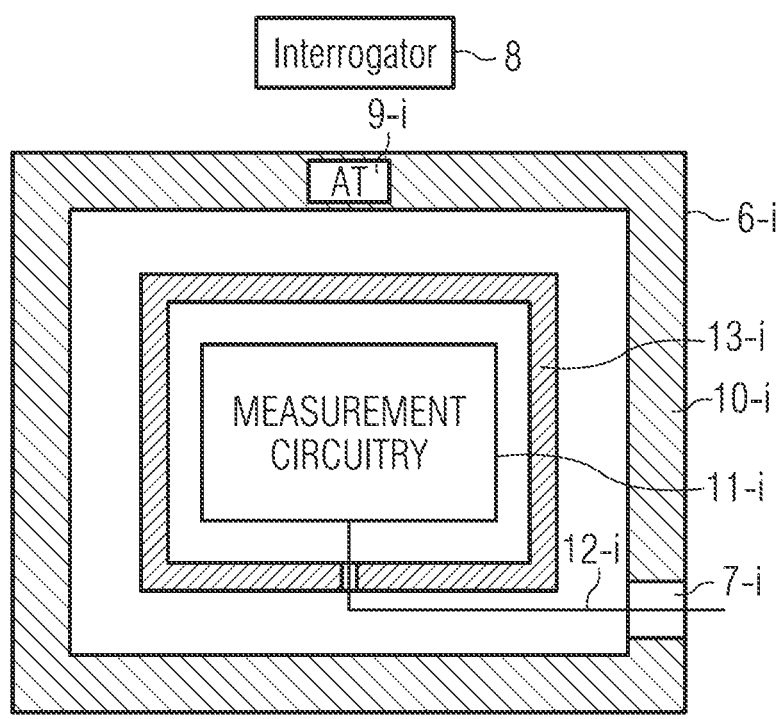
FIGS. 2A, 2B show schematic cross-section views of exemplary measurement devices comprising an integrated asset tag according to an aspect of the present invention.

FIG. 1 schematically shows an exemplary embodiment of a facility 1 such as a production facility comprising an asset management system according to an aspect of the present invention.

As can be seen in the exemplary embodiment of FIG. 1, the production facility 1 may comprise a data network, in particular a local area network 2, connecting distributed manufacturing machines 3-1, 3-2 to a server 4 having access to a database 5. The production facility 1 can comprise a plurality of distributed measurement devices 6-1, 6-2, 6-3 connected to the local area network 2 via at least one data interface 7-1, 7-2, 7-3. The connections between the measurement devices 6-$i$ and the local area network 2 of the production facility can be wired as illustrated in FIG. 1 or wireless. The number of manufacturing machines 3-$i$ and measurement devices 6-$i$ of the production facility 1 can vary. In the simple exemplary embodiment illustrated in FIG. 1, the production facility comprises two manufacturing machines 3-1, 3-2 and three measurement devices 6-1, 6-2, 6-3. The production facility 1 comprises an asset management system, AMS, including a mobile interrogator 8 which can be carried by a supervisory person SP such as an engineer or a technician to collect asset data by reading asset data from asset tags 9-1, 9-2, 9-3 being inseparable from an associated measurement device 6-1, 6-2, 6-3.

Each measurement device 6-$i$ comprises at least one corresponding inseparable asset tag 9-$i$. In a possible embodiment, the at least one asset tag 9-$i$ is integrated in a housing of the associated measurement device 6-$i$. In a further possible embodiment, the at least one asset tag 9-$i$ is attached inseparable to the housing of the corresponding measurement device 6-$i$. Each measurement device 6-$i$ of the facility 1 shown in FIG. 1 comprises an integrated measurement circuitry 11-$i$ with a surrounding high frequency, HF, shield 13-$i$ adapted to shield the measurement circuitry 11-$i$ from external high frequency, HF, interference signals or very high frequency interference signals, VHF. The measurement circuitry can comprise components operating at high frequencies of more than 3 MHz. The inseparable asset tag 9-$i$ of the measuring device 6-$i$ is located outside this high frequency shield 13-$i$. The asset tag 9-$i$ is configured to communicate with the external interrogator 8 of the asset management system AMS within a communication range of the asset tag 9-$i$. In a possible embodiment, the asset tag 9-$i$ is not connected to the internal measurement circuitry of the measurement device 6-$i$ but can be molded within a housing of the measurement device. In this embodiment, the asset tag can comprise static asset SAD data such as the serial number SN of a stacked measurement device 6-$i$, manufacturing date MD of the measurement device 6-$i$ or a type of the measurement device 6-$i$. In a possible embodiment, the asset tag 9-$i$ is a read asset tag which allows only reading of asset data from the asset tag 9-$i$. In an alternative embodiment, the asset tag 9-$i$ comprises also a writable memory which allows writing of data to the asset tag 9-$i$. In a further alternative embodiment, the asset tag 9-$i$ is connected to the internal measurement circuitry 11-$i$ of the measurement device 6-$i$ through the high frequency shield 13-$i$. In this embodiment, the asset tag also provides dynamic asset data DAD indicating the current state of the internal measurement circuitry 11-$i$ of the measurement device 6-$i$. The asset data AD can comprise for instance the spent or remaining operation lifetime of the measurement device 6-$i$. The asset data AD can comprise for instance indication flags indicating specific requirements or requests of the measurement device 6-$i$ to the asset management system AMS. The at least one asset tag 9-$i$ is in a preferred embodiment an autonomous asset tag configured to communicate with the external interrogator 8 of the asset management system AMS independently from the current operation state of the measurement device 6-$i$. An asset management server within the control unit 4 of the facility 1 is configured to perform an asset management of a plurality of distributed measurement devices 6-$i$ on the basis of asset data AD received from asset tags of the distributed measurement devices 6-$i$. Accordingly, asset data read from an asset tag 9-$i$ by the interrogator 8 is forwarded via a network, for instance a local area network 2, as illustrated in FIG. 1 to the control unit 4 comprising the asset management server. In a possible embodiment, the asset management server of the asset management system AMS is adapted to evaluate the received current states of measurement devices 6-$i$ on the basis of the received dynamic asset data DAD to identify those measurement devices 6-$i$ within the production facility 1 requiring a calibration and/or a recalibration of internal components of the respective measurement circuitry due to environmental influences or aging of the components. In a possible embodiment, the different distributed measurement devices 6-$i$ each comprise an internal operation time measurement unit, such as a counter, adapted to measure the operation time of the respective measurement device 6-$i$ and to set a calibration request indication flag CRIF if the operation time of the measurement device 6-$i$ exceeds a predetermined threshold value. In a possible embodiment, the asset tag 9-$i$ of the measurement device 6-$i$ is adapted to transmit the calibration request indicator flag CRIF as asset data to the interrogator 8 via a wireless link, wherein the interrogator 8 supplies the received calibration request indication flag CRIF along with an identifier ID of the measurement device 6-$i$ to the asset management server of the asset management system AMS. In a possible embodiment, the identified measurement device 6-$i$ to be recalibrated is transported to a remote calibration apparatus outside the production facility 1 configured to recalibrate the identified measurement device 6-$i$. In this embodiment, the asset management system AMS is notified by the measurement device 6-$i$ itself in case that recalibration of the respective measurement device 6-$i$ is required. In a possible embodiment, the measurement device 6-$i$ can itself set at least one corresponding calibration request indicator flag CRIF in response to an event. This event can be in a possible embodiment the reaching of a predetermined threshold value after a predetermined operation lifetime. In a further possible embodiment, the events can be preconfigured and depend on local sensor data provided by local sensors of the respective measurement device 6-$i$. If the sensor data indicate that the environmental conditions of the respective measurement device 6-$i$ go beyond a predetermined range, recalibration of components of the measurement circuitry might be necessary and a corresponding calibration request indicator flag CRIF is set in the asset tag 9-$i$.

In a possible embodiment, the measurement device 6-$i$ can comprise at least one active asset flag and/or at least one passive asset tag. In a possible embodiment, each measurement device 6-$i$ can comprise different kinds of asset tags 9-$i$, in particular a short range asset tag, a middle range asset tag and a wide range asset tag. In a possible embodiment, the long range asset tag having a range of e.g. 100 m is evaluated to locate the respective measurement device 6-$i$ in a production hall of the production facility 1. By using the mobile interrogator 8 a supervisory person SP can locate a specific measurement device 6-$i$ within the production hall by reading asset data from the long range asset tag LRAT provided at the measurement device 6-$i$. When approaching the measurement device 6-$i$, the interrogator 8 is switched over to another operation mode to receive asset data from a short range asset tag SRAT of the measurement device 6-$i$ to read out a different kind of asset data provided by the short range asset tag. In a still further possible embodiment, the measurement device 6-$i$ can comprise not only a short range asset tag SRAT and a long range asset tag LRAT, but also a middle range asset tag MRAT which can be used as a hidden antitheft asset tag which is adapted to communicate with an interrogator 8 or with an asset tag reader which can be located for instance at a door of the production hall to detect an unwanted removal of a measurement device 6-$i$ from the production facility 1.

Figure 10:
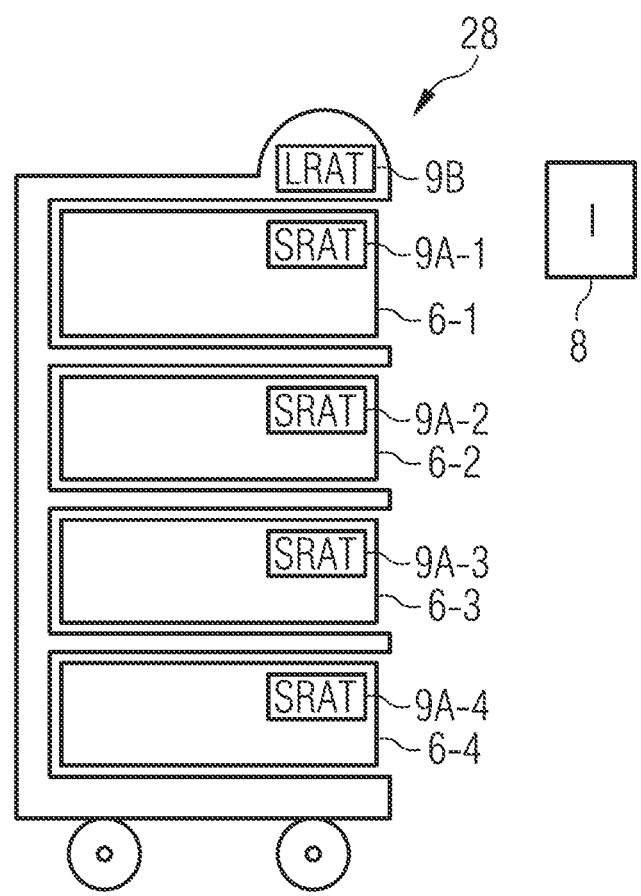
FIG. 10 shows a cross-section view through an exemplary embodiment of a measurement device rack according to a further aspect of the present invention.

In a possible embodiment, the short range asset tag can comprise a near field communication, NFC, asset tag. In a further possible embodiment, the long range asset tag can comprise a Bluetooth asset tag. In a possible embodiment, the range of an asset tag can be preconfigured or adjusted depending on the use case. Several measurement devices 6-$i$ can be stacked upon each other and located in a measurement device rack 28 as shown in FIG. 10.

Figure 2B:
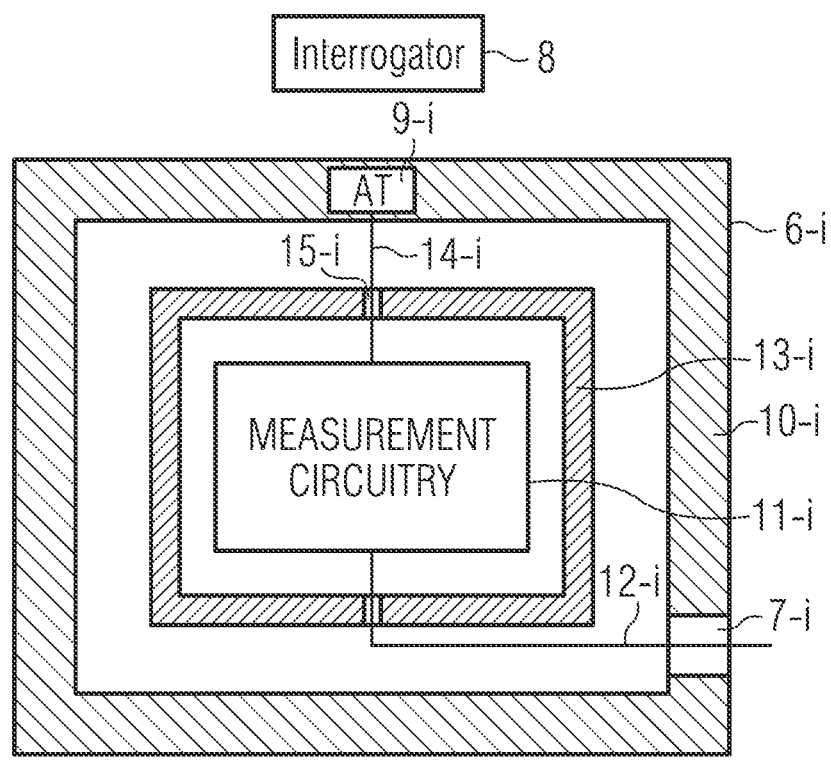

FIGS. 2A, 2B show possible exemplary embodiments of a measurement device according to a first aspect of the present invention. As can be seen in FIG. 2A, the measurement device 6-$i$ comprises associated integrated asset tags 9-$i$ which can be molded into the housing 10-$i$ of the measurement device 6-$i$ as illustrated in FIG. 2A. Within the housing 10-$i$ of the measurement device 6-$i$, the measurement device 6-$i$ comprises a measurement circuitry 11-$i$ which can consist of a plurality of electronic components. The measurement circuitry 11-$i$ can be sensitive to high frequency signals. In a possible embodiment, the measurement circuitry 11-$i$ performs high frequency measurements of external measurement setups or circuits to be monitored. In the shown embodiment of FIG. 2A, the measurement circuitry 11-$i$ is connected via signal lines such as data lines 12-$i$ to a data interface 7-$i$ connecting the measurement devices 6-$i$ to the local area network 2 of the production facility 1. The measurement device 6-$i$ comprises a high frequency shield 13-$i$ surrounding the measurement circuitry 11-$i$ to protect it against external high frequency, HF, signals influencing negatively the measurements performed by the measurement circuitry 11-$i$. The high frequency shield 13-$i$ can be a metal form or a metal casing. As can be seen in FIG. 2A, the asset tag 9-$i$ is located outside the high frequency shield 13-$i$ to allow reading by the interrogator 8. In a possible embodiment, the high frequency shield 13-$i$ is made of a shielding material, in particular metal. In the exemplary embodiment of FIG. 2A, the asset tag 9-$i$ integrated in the housing 10-$i$ of the measurement device 6 is not connected to the measurement circuitry 11-$i$ and supplies only static asset data SAD to the interrogator 8. These static asset data SAD can comprise for instance a serial number SN of the measurement device 6-$i$, a production date of the measurement device or data indicating the specific type of the measurement device 6-$i$.

In the exemplary second embodiment shown in FIG. 2B, the asset tag 9-$i$ integrated in the housing 10-$i$ of the measurement device 6-$i$ is connected via signal lines 14-$i$ to the measurement circuitry 11-$i$ shielded by the surrounding high frequency shield 13-$i$. The signal lines 14-$i$ are isolated from the high frequency shield 13-$i$ and go through a hole 15-$i$ as illustrated in FIG. 2B. In the embodiment shown in FIG. 2B, the asset tag 9-$i$ not only provides static asset data SAD, but also dynamic asset data DAD which can indicate a current operation state of the measurement device 6-$i$. This dynamic asset data DAD can for instance indicate a calibration state of the measurement circuitry 11-$i$. Further, the dynamic asset data DAD supplied by the measurement circuitry 11-$i$ to the integrated asset tag 9-$i$ can indicate defect components within the measurement circuitry 11-$i$ which have to be replaced during maintenance. Further, the dynamic asset data DAD can comprise local sensor data to indicate the current operation situation of the measurement device 6-$i$.

Figure 3A:
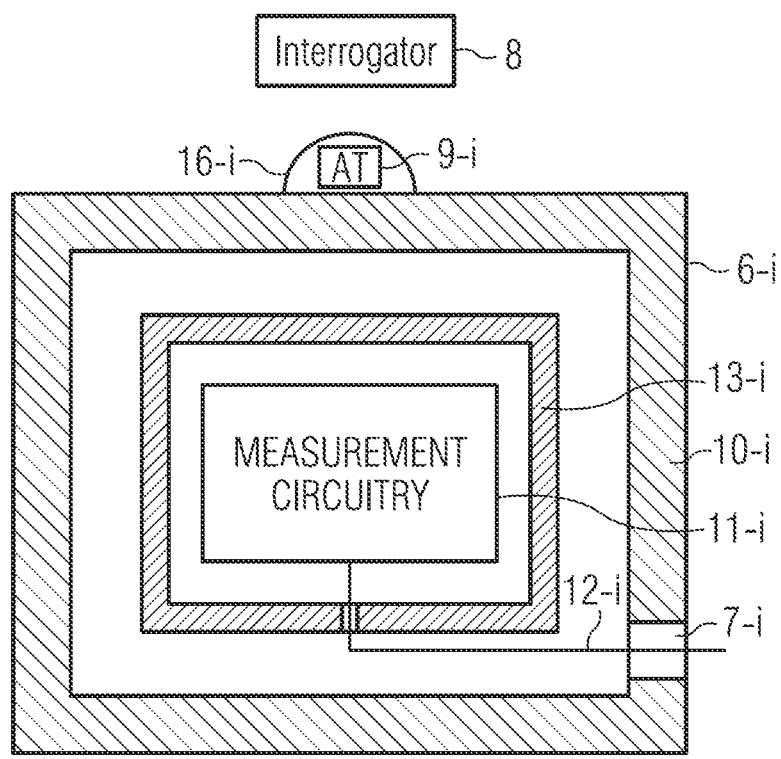
FIGS. 3A, 3B show further possible embodiments of measurement devices with an inseparable asset tag according to an aspect of the present invention.
Figure 3B:
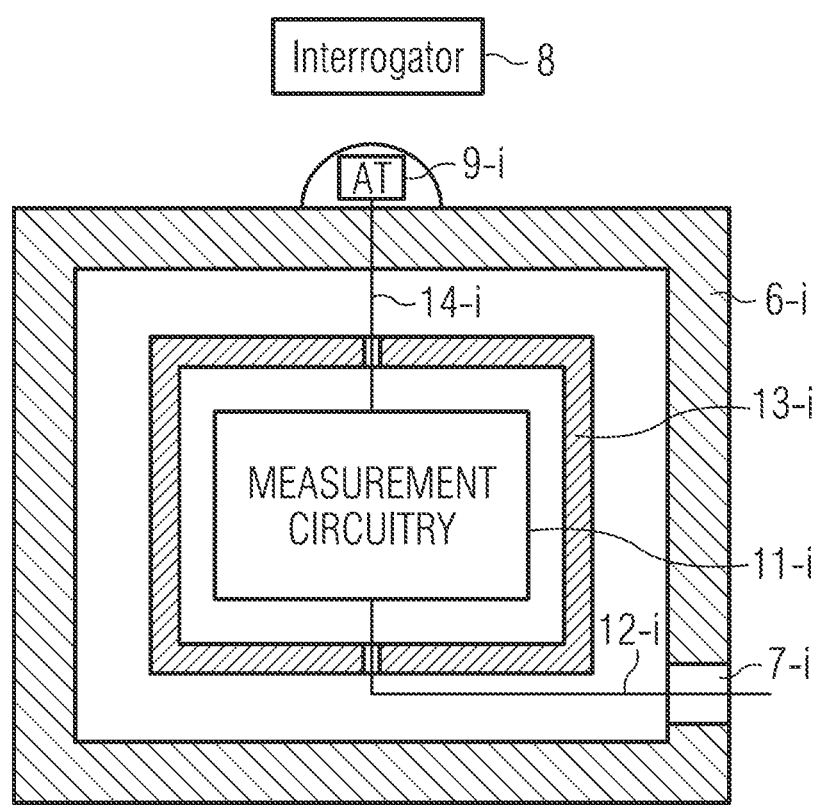

FIG. 3A shows a further exemplary third embodiment of a measurement device 6-$i$ according to the first aspect of the present invention. In the third embodiment shown in FIG. 3A, the asset tag 9-$i$ is not integrated in the housing 10-$i$ of the measurement device 6-$i$, but attached within a casing 16-$i$ to the outside surface of the housing 10-$i$ of the measurement device 6-$i$. The connection between the casing 16-$i$ and the housing 10-$i$ is inseparable. In a possible embodiment, the casing 16-*i* of the asset tag 9-*i* is glued to the housing 10-*i* of the measurement device. In an alternative embodiment, the casing 16-*i* can be riveted to the housing 10-*i* of the measurement device 6-*i*. In the embodiment shown in FIG. 3A, there is no signal connection between the asset tag 9-*i* and the internal circuitry of the measurement device. In the fourth embodiment illustrated in FIG. 3B, the asset tag 9-*i* is connected via signal lines 14-*i* to the internal measurement circuitry 11-*i* of the measurement device 6-*i*. As shown in the fourth embodiment of FIG. 3B, the asset tag 9-*i* is adapted to provide static asset data SAD but also dynamic asset data DAD to the interrogator 8 by a wireless link.

Figure 4A:
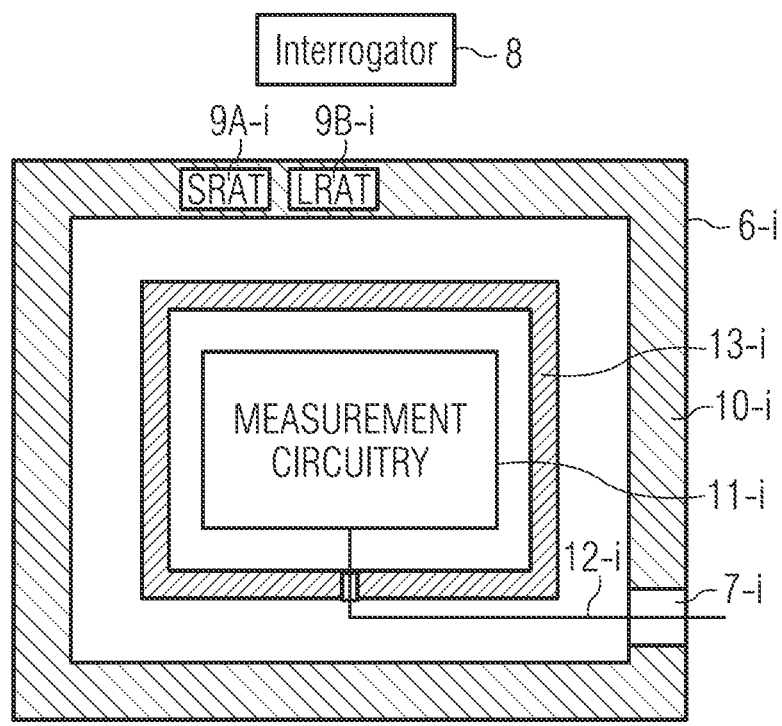
FIGS. 4A, 4B show further cross-section views of exemplary embodiments of a measurement device with two integrated asset tags according to an aspect of the present invention.
Figure 4B:
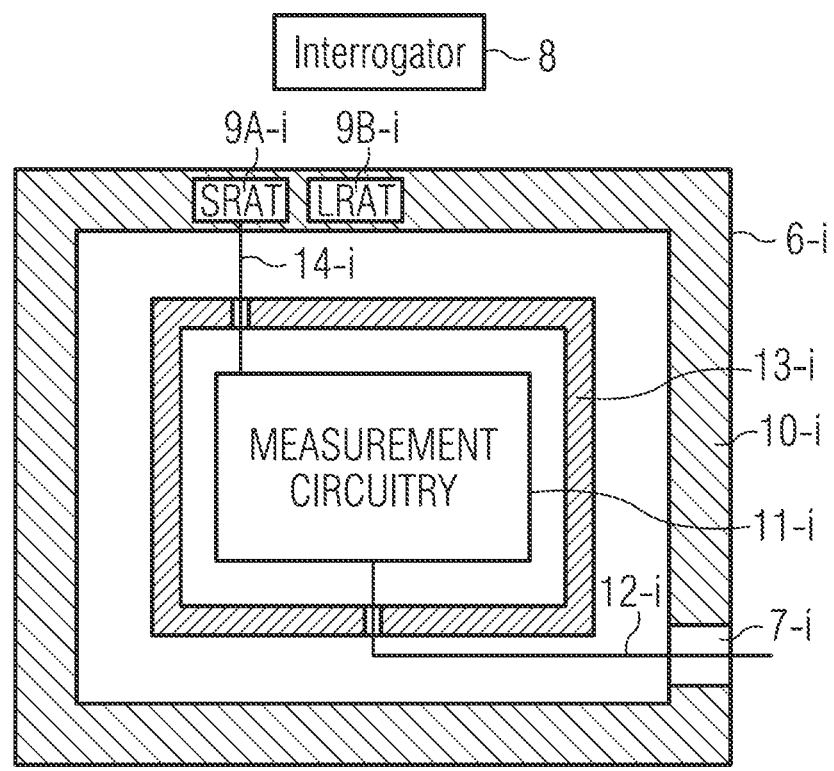

FIGS. 4A, 4B show further exemplary embodiments of a measurement device 6-*i* according to the first aspect of the present invention. In the embodiments shown in FIGS. 4A, 4B, the measurement device 6-*i* comprises two different asset tags with different ranges. In the specific fifth embodiment shown in FIG. 4A, the measurement device 6-*i* comprises a short range asset tag 9A-*i* and a long range asset tag 9B-*i* both integrated in the housing 10-*i* of the measurement device 6-*i*. Both asset tags 9A-*i*, 9B-*i* are located outside the high frequency shield 13-*i* of the measurement device 6-*i*. The short range asset tag 9A-*i* comprises a short range of e.g. less than 0.2 m and the long range asset tag 9B-*i* comprises a long range of e.g. 100 m. In a possible exemplary embodiment, the short range asset tag 9A-*i* can be a near field communication, NFC, tag. Further, the long range asset tag 9B-*i* can in a possible embodiment be a Bluetooth asset tag. In a possible embodiment, the transmission ranges of the asset tags are preconfigured. In an alternative embodiment, the transmission range of each asset tag can be adjusted depending on the use case. In a possible exemplary embodiment, both asset tags 9A-*i* and 9B-*i* can be read by the same interrogator 8 which can work in two different operation modes. In the fifth embodiment shown in FIG. 4A both asset tags 9A-*i*, 9B-*i* have no signal connection to the internal measurement circuitry 11-*i* of the measurement device 6-*i*. In this embodiment, both asset tags provide only static asset data SAD to the interrogator 8 via the wireless link. FIG. 4B shows an exemplary sixth embodiment, wherein the short range asset tag 9A-*i* comprises a signal connection 14-*i* to the internal measurement circuitry 11-*i* of the measurement device 6-*i*. In this specific embodiment, the short range asset tag 9A-*i*, for instance a near field communication, NFC, asset tag, can receive dynamic asset tag data from the measurement circuitry 11-*i* which can be read by the interrogator 8. Since the short range of the wireless link between the interrogator 8 and the short range asset tag 9A-*i* is less than 20 cm, the interrogator 8 will receive only asset data from the closest measurement device 6-*i* and not from other measurement devices in the vicinity of the measurement device 6-*i*. Consequently, the risk of confusing asset data of different measurement devices 6-*i* located close to each other, for instance in a measurement device rack, is eliminated. In a possible embodiment, the long range asset tag 9B-*i* can provide asset data which can be used by the asset management system AMS to find the location of the measurement device 6-*i* within a production hall of a production facility 1. In a possible embodiment, the interrogator 8 can be switched between a first search operation mode to find a measurement device 6-*i* within the production facility 1 and a second operation to read out asset data indicating a current operation state of the measurement device 6-*i* by using the short range asset tag 9A-*i*.

Figure 5:
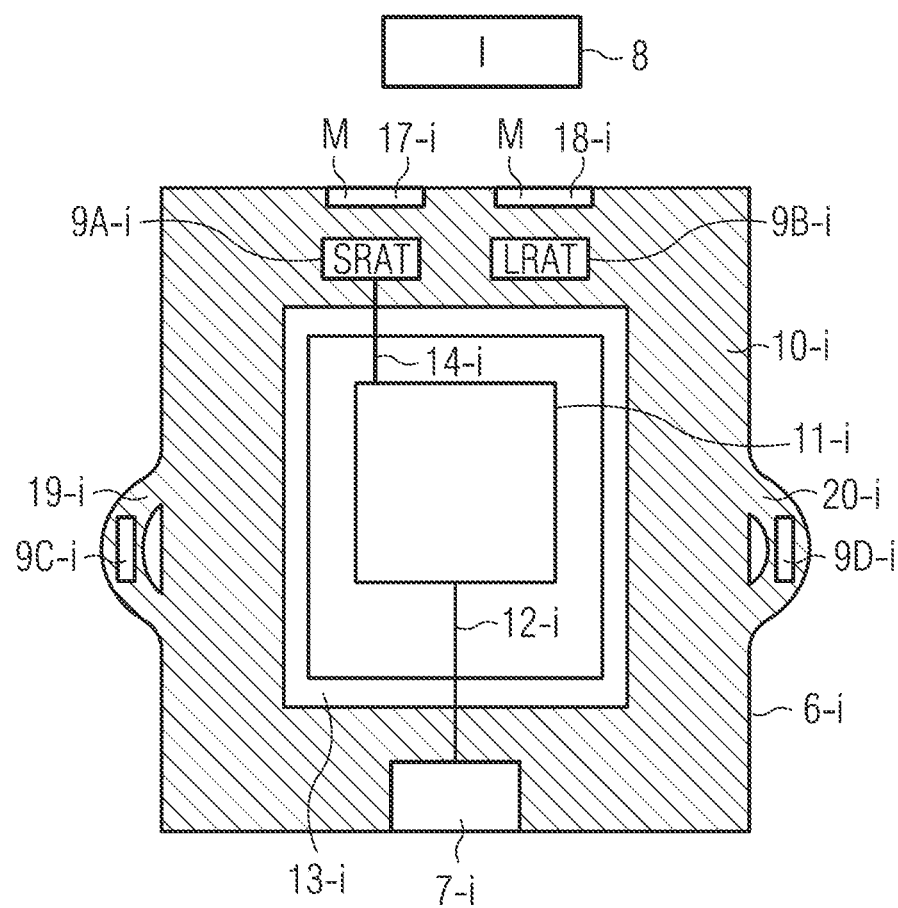
FIG. 5 shows a schematic cross-section view of a further exemplary embodiment of a measurement device with integrated asset tags according to an aspect of the present invention.

FIG. 5 shows a cross-section view of a further exemplary seventh embodiment of a measurement device according to the first aspect of the present invention. In this exemplary embodiment, the measurement device 6-*i* comprises three different kinds of asset tags. In the housing 10-*i* of the measurement device 6-*i* a short range asset tag 9A-*i* and a long range asset tag 9B-*i* are integrated as illustrated in FIG. 5. Both asset tags 9A-*i*, 9B-*i* comprise a corresponding marking 17-*i*, 18-*i* which makes it easier for a user carrying the interrogator 8 to find the corresponding integrated asset tags at the housing 10-*i* of the measurement device 6-*i*. Besides the short range asset tag 9A-*i* and the long range asset tag 9B-*i*, the measurement device 6-*i* further comprises two hidden middle range asset tags 9C-*i*, 9D-*i* having the same or different transmission ranges. In a possible embodiment, the hidden middle range asset tags 9C-*i*, 9D-*i* have a range between 5 and 10 m. The middle range asset tags can be used to prevent unnotified and unwanted removal of measurement devices 6-*i* from a production hall of the production facility 1. For instance, if an unauthorized person carrying a measurement device 6-*i* outside the production hall through the door, he will pass a reader or a stationary interrogator which reads out the asset tag data provided by the hidden middle range asset tags 9C-*i*, 9D-*i*. In the exemplary embodiment of FIG. 5, the hidden middle range asset tags 9C-*i*, 9D-*i* are hidden or molded within two handles 19-*i*, 20-*i* of the measurement device 6-*i*. The number of middle range antitheft asset tags may vary in different embodiments depending on the size and form of the housing of the measurement device 6-*i* and its value. The hidden middle range antitheft tags do not comprise any markings so that the person carrying the measurement device 6-*i* out of the production hall will not be aware that hidden antitheft asset tags are integrated in the housing of the measurement device 6-*i*. When passing through the door of the production hall, the asset tag data transmitted by the middle range asset tag to the stationary interrogator 8 can trigger an action such as an alarm or the closing of doors in a building. The asset tag data stored in the middle range antitheft asset tags 9C-*i*, 9D-*i* can comprise different kinds of data, in particular an identifier ID of the measurement device 6-*i* allowing to estimate the value of the removed measurement device 6-*i* which can be stored in the database 5 of the asset management system AMS illustrated in FIG. 1.

Figure 6:
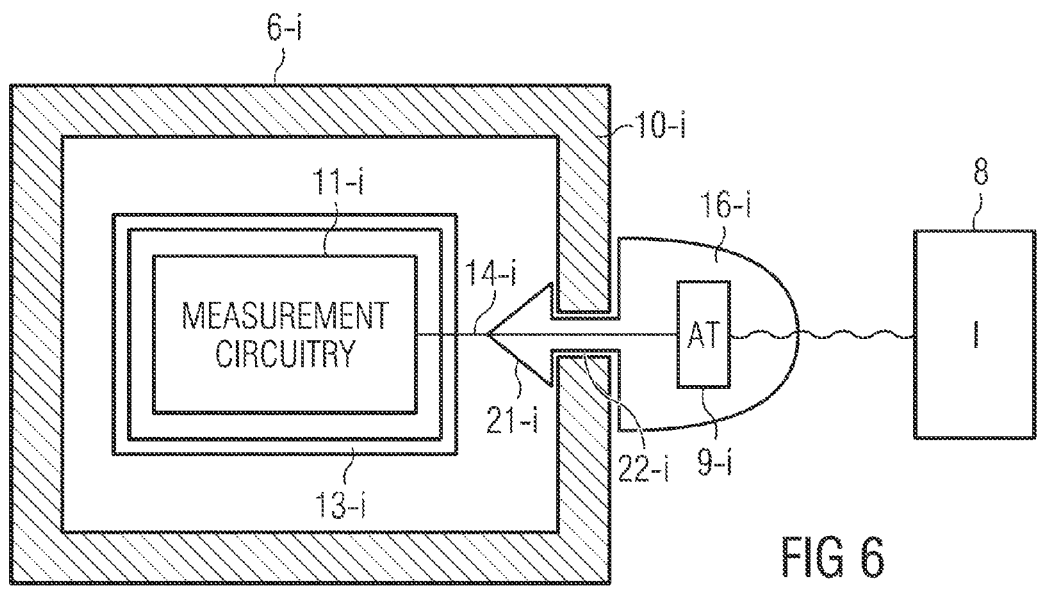
FIG. 6 shows a further schematic cross-section view of an exemplary embodiment of a measurement device with an inseparable asset tag according to an aspect of the present invention.

FIG. 6 shows a further exemplary eighth embodiment of a measurement device 6-*i* according to the first aspect of the present invention. In the specific embodiment shown in FIG. 6, an asset tag 9-*i* is molded in a casing 16-*i* which can be inserted by means of a snap connection 21-*i* through a hole or opening 22-*i* to the housing 10-*i* of a measurement device 6-*i*. After having inserted the snap connection into the hole or slot of the housing, the inserted casing 16-*i* cannot be removed from the housing 10-*i*. In the specific embodiment shown in FIG. 6, the asset tag 9-*i* is connected via a signal line 14-*i* to the internal measurement circuitry 11-*i* to get also dynamic asset data DAD indicating the current operation state of the measurement circuitry 11-*i*. In this embodiment, it is necessary to connect the asset tag 9-*i* internally to the measurement circuitry 11-*i* after having inserted the casing 16-*i* through the hole or slot 22-*i* of the housing 10-*i*. For this purpose, a lid in the housing 10-*i* might be opened by a technician to perform the necessary connection with the measurement circuitry 11-*i*. In a possible embodiment, one component of the measurement circuitry 11-*i* might be replaced, such as a printed circuit board, and connected with the asset tag 9-*i*. With the embodiment shown in FIG. 6, it is possible to equip existing measurement devices with asset tags 9-*i* of the asset management system AMS. Many existing measurement devices 6-*i* comprise ventilation slots or ventilation openings which can be used for inserting or attaching asset tags 9-*i* molded in a casing 16-*i* which cannot be removed from the housing 10-*i* of the measurement device 6-*i*. In the embodiment shown in FIG. 6, the asset tag 9-*i* is connected to the measurement circuitry 11-*i* by a signal line 14-*i*. In an alternative exemplary embodiment, the asset tag 9-*i* is not connected with the measurement circuitry 11-*i* and stores only static asset data SAD.

Figure 7:
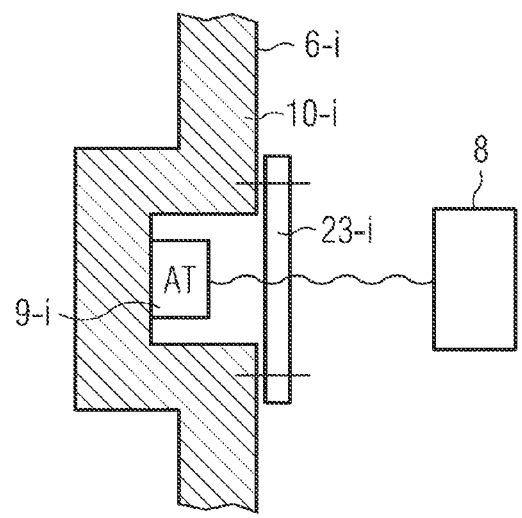
FIG. 7 shows a partial cross-section view through a housing of an exemplary embodiment of a measurement device with an inseparable asset tag according to an aspect of the present invention.

FIG. 7 shows a further exemplary ninth embodiment for a measurement device 6-*i* according to the first aspect of the present invention. In the shown exemplary embodiment, the asset tag 9-*i* is attached to a housing 10-*i* of the measurement device 6-*i* in a specific chamber closed by a signal transparent lid 23-*i* allowing communication with the external interrogator 8. The lid 23-*i* can be fixed to the housing 10-*i* by rivets as illustrated in FIG. 7 or glued on the housing 10-*i*. In a possible embodiment, the housing 10-*i* is made from metal and the asset tag 9-*i* can be clipped to the metal by a magnet.

Figure 8:
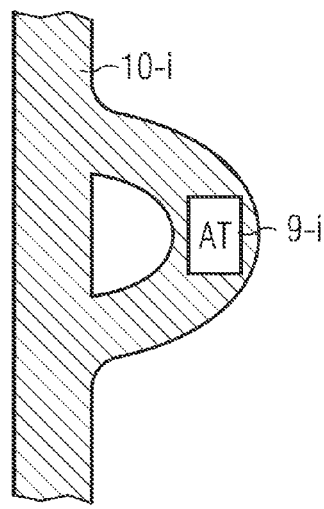
FIG. 8 shows a partial cross-section view through a housing of an exemplary embodiment of a measurement device with an integrated asset tag according to an aspect of the present invention.

FIG. 8 shows a further exemplary tenth embodiment, wherein the asset tag 9-*i* is embedded in a protrusion of the molded housing 19-*i* of the measurement device 6-*i*, for instance in a handle or the like.

Figure 9:
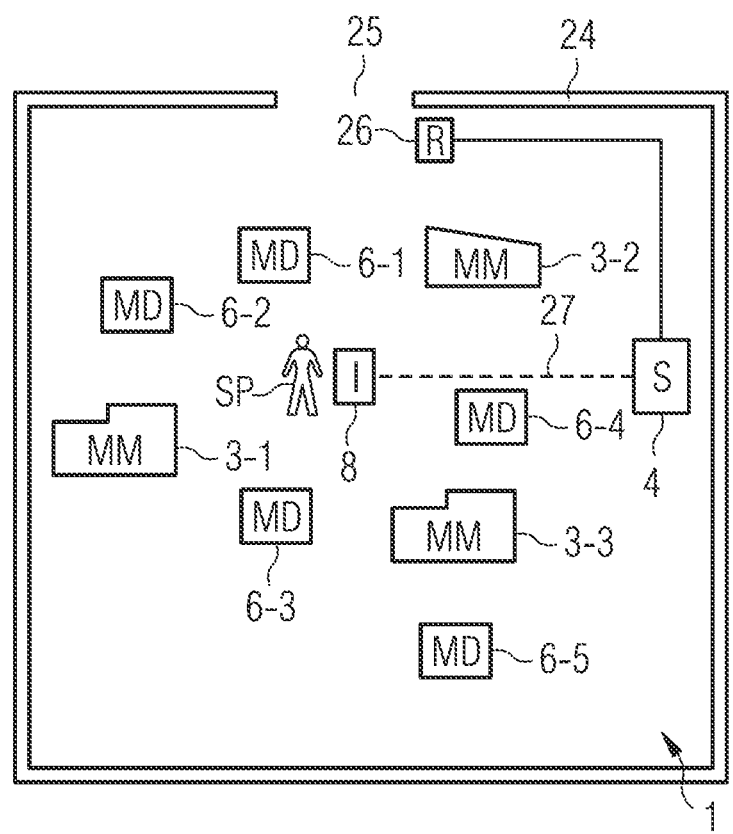
FIG. 9 shows a schematic diagram for illustrating an exemplary embodiment of a facility comprising a plurality of distributed measurement devices according to an aspect of the present invention.

FIG. 9 shows a schematic diagram for illustrating the production facility 1 having an asset management system AMS according to an aspect of the present invention. The production facility 1 comprises in the shown exemplary embodiment a production hall illustrated by a wall 24 having a single door 25, where a local interrogator or a stationary reader device 26 is located. The production facility comprises three manufacturing machines 3-1, 3-2, 3-3 controlled by a server 4 of the production facility 1. The production facility 1 comprises a plurality of measurement devices 6-1, 6-2, 6-3, 6-4, 6-5 distributed in the production hall of the production facility 1. The mobile interrogator 8 is carried by a supervisory person SP in the production hall, wherein the interrogator 8 is connected via a wireless link 27 to the server 4. In a possible embodiment, the mobile asset management interrogator 8 is switchable between at least two operation modes. In a possible embodiment, the asset management interrogator 8 is configured to read in a first operation mode first asset data from long range asset tags attached to the distributed measurement devices 6-*i* and is configured to read in a second operation mode second asset data from short range asset tags attached to the distributed measurement devices 6-*i*. The asset data received by the asset management interrogator 8 in the first operation mode can be used to search and find a specific measurement device 6-*i* within the production hall. For instance, the measurement device may comprise a long range Bluetooth asset tag with a range of more than 50 m to provide identification information asset tag data received by the interrogator 8 to find a specific measurement device 6-*i*. For instance, data stored in the database 5 of the asset management system can indicate that a specific measurement device 9-*i* has been recalibrated 12 months ago and may need recalibration. By using the long range asset tag data, the distributed measurement devices and interrogator 8 can locate the target measurement device 6-*i* which may need recalibration. After having reached the searched measurement device 6-*i*, the supervisory person SP can switch the interrogator 8 from the first operation mode into the second operation mode to read out the second asset data from the short range asset tag, for instance a near field communication tag. This asset tag can indicate in a possible embodiment the current operation state of the measurement device and indication data indicating, whether the measurement device 6-*i* really needs recalibration. If the asset tag data indicates that the respective measurement device 6-*i* needs recalibration, the measurement device 6-*i* can be transported physically to a remote recalibration apparatus, for instance to the manufacturer of the measurement device to perform the necessary recalibration of the components in its measurement circuitry. A reading device or a stationary interrogator 26 placed at the door 25 of a production hall can read out asset data provided by middle range asset tags in the housing of the measurement devices 6-*i* and detect unwanted removal of measurement devices from the production facility 1.

FIG. 10 shows a view on an exemplary embodiment of a measurement device rack 28 according to a further aspect of the present invention. In the exemplary embodiment of FIG. 10, the rack 28 comprises four different measurement devices 6-1, 6-2, 6-3, 6-4 stacked in the rack 28, wherein each measurement device 6-*i* comprises an integrated short range asset tag 9-1, 9-2, 9-3, 9-4 which may be located at the front side of the measurement device 6-*i*. The measurement device rack 28 further comprises a long range asset tag 9B integrated in the measurement device rack 28. The short range asset tags 9A-*i* and the long range asset tags 9B can be read out by the asset management interrogator 8 in different operation modes. In a first operation mode, the interrogator 8 uses the asset data provided by the long range asset tag 9B to find the location of the rack 28. After having found the searched rack 28, the supervisory person SP can move the interrogator 8 along the different measurement devices 6-*i* to read out one short range asset tag 9A-*i* after the other. In a possible embodiment, the range of the short range asset tags 9A-*i* is preconfigured or adjusted to $$R = \tfrac{1}{2} \mathrm{Min}(W, H, L),$$

wherein
W is the width of the housing of the measurement device,
H is the height of the housing of the measurement device, and
L is the length of the housing of the measurement device.

In a further possible embodiment, the asset tags can comprise a write memory to which configuration data can be written by the interrogator 8 of the asset management system AMS. In a still further possible exemplary embodiment, the asset tag 9-*i* can comprise a wireless transceiver and a proximity detection unit. In a possible embodiment, the proximity detection unit is configured to detect the presence of the interrogator 8 of the asset management system AMS in the vicinity of the asset tag 9-*i* and to push automatically asset data to the interrogator 8 if the interrogator 8 is within the range of the asset tag. In a possible embodiment, the proximity detection unit of the asset tag can comprise a near field communication NFC proximity detection unit. In a possible embodiment, the presence of the mobile interrogator 8 is detected by the wireless near field communication asset tag. After having detected the presence of the interrogator in the vicinity of the asset tag, the asset tag may push automatically the asset tag data to the interrogator 8. In an alternative specific embodiment, the asset tag may not only comprise a near field communication transceiver, but also a Bluetooth transceiver to switch over the near field communication to Bluetooth communication after having detected the interrogator 8 in the vicinity of the asset tag. After having established the Bluetooth communication link with the interrogator 8 dynamic asset tag data can be pushed automatically to the asset management interrogator 8 and forwarded to the asset management server.

Figure 11:
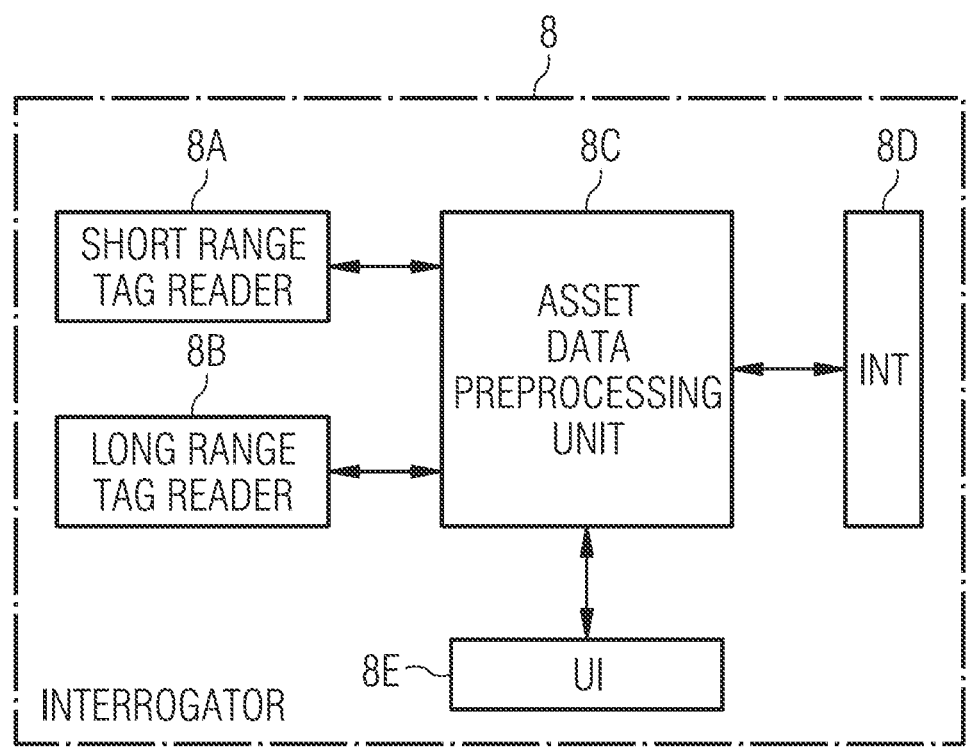
FIG. 11 shows a block diagram illustrating a possible exemplary embodiment of an interrogator used in an asset management system according to an aspect of the present invention.

FIG. 11 shows a block diagram of an exemplary embodiment of an asset management interrogator 8 according to a further aspect of the present invention. The asset management interrogator 8 comprises a short range tag reader 8A to read asset tag data from short range asset tags 9A-*i* and a long range tag reader 8B to read asset tag data from a long range asset tag 9B-*i*. The short range tag reader 8A and the long range tag reader 8B can be connected to an asset data preprocessing unit 8C of the interrogator 8 and forwarded to the asset management server via an interface 8D of the interrogator 8. The interrogator 8 further comprises a user interface 8E for a supervisory person SP carrying the mobile interrogator 8 through the facility 1. By means of the user interface, such as a graphical user interface GUI, the supervisory person SP can switch the asset management interrogator 8 between different operation modes. In a possible embodiment, the mobile asset management interrogator 8 is switchable between two operation modes. In the first operation mode, the long range tag reader 8B is activated and the interrogator 8 reads first asset data from long range asset tags attached to distributed measurement devices. In the second operation mode of the mobile asset management interrogator 8, the short range tag reader 8A is activated to read second asset data from short range asset tags 9A-*i* attached to distributed measurement devices 6-*i*.

Figure 12:
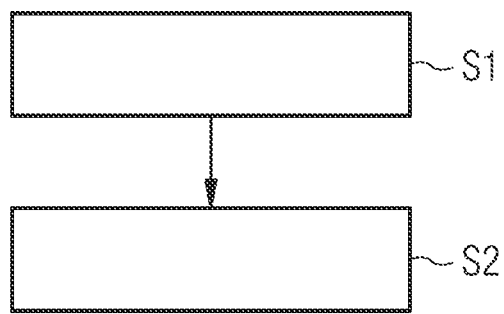
FIG. 12 shows a flow chart for illustrating a possible exemplary embodiment of a method for providing asset data of a plurality of distributed measurement devices according to a further aspect of the present invention.

FIG. 12 shows a flow chart of an exemplary embodiment of a method for providing asset data of a plurality of distributed measurement devices according to a further aspect of the present invention. In a further step S1, asset data is read from at least one inseparable asset tag of monitored measurement devices, said asset tag being located outside a high frequency shield protecting an internal measurement circuitry of the measurement device from external high frequency signals.

In a further step S2, the read asset data is processed by an asset management server to perform asset management of the distributed measurement devices.

The invention further provides according to a further aspect a computer readable program product comprising instructions which when executed on a program or circuit of a computer cause the programmable circuit to be operated to perform the method illustrated in FIG. 12. The term instruction may be understood to denote an operation of a programmable circuit or processing unit within a computer system. As described with reference to the embodiments shown in FIGS. 1 to 12, the asset management system AMS according to an aspect of the present invention can be used for a variety of applications. For instance, the asset management system AMS can be used in a production facility, where a plurality of different measurement devices 6-*i* are used to provide measurement signals or data for production or manufacturing machines of a production line. Further, the measurement devices 6-*i* can be located in a laboratory for performing research. The asset management system AMS can be used for asset tags with different radio ranges for performing different tasks. Long range asset tags attached to the measurement devices can be used mainly to locate measurement devices within the production facility. Middle range asset tags can be used to increase security against unwanted removal of measurement devices from a facility. Short range asset tags can be used to supply the asset management system AMS with static and/or dynamic asset data of the monitored measurement devices. Short range asset tags can be used to avoid confusion of different measurement devices being located close to each other, for instance in a measurement device rack as shown in FIG. 10. An asset management interrogator 8 of the asset management system AMS can be switched between different operation modes to read out different types of asset tags with different asset tag radio ranges. In a possible embodiment, the asset tags can comprise RF-ID tags. Asset data stored in the asset tags 9-*i* can comprise a wide variety of different data, for instance a serial number SN of the measurement device 6-*i*, an inventory number of the measurement device 6-*i*, an asset number of the measurement device, an order number, a production date of the measurement device, calibration data or position data facilitating the storage of the tagged measurement device such as the number of a room in a building, an identifier ID of a measurement device rack 28 or even the position of the measurement device within the rack 28. The asset tags can use encoded radio transmissions of the asset tag data. The asset tags can be active asset tags or passive asset tags. In a possible embodiment, the active asset tags can be powered by a power supply of the measurement device 6-*i*. In an alternative embodiment, the active asset tags can be powered by an integrated battery. With the asset management system AMS according to the present invention it is possible to track different assets, in particular measurement devices in real time throughout the entire life cycle. From a customer's point of view from purchase to retirement, the employed asset tags ensure that the assets, e.g. measurement devices 6-*i*, are tracked continuously without manual intervention, thus eliminating errors to provide an accurate dependable database necessary for making planning and management decisions. The asset tags can include motion and temperature detection sensors or customizable data rates and a variety of mounting and enclosure options as illustrated in the different embodiments.

The asset tags are used for different or the same communication protocols when communicating with the interrogator 8 of the asset management system AMS. In a possible embodiment, the asset data is automatically pushed to the interrogator when coming close to the asset tag 9-*i*. This makes it simpler for a supervisory person SP to collect necessary asset tags from a plurality of distributed measurement devices 6-*i*. The measurement device 6-*i* can comprise RF measurement equipment such as oscilloscopes, signal generators, signal analyzers or test devices. With the asset management system AMS according to the present invention, calibration or recalibration of a plurality of measurement devices 6-*i* continuously or on demand is facilitated significantly. Also, maintenance of a plurality of measurement devices 6-*i* can be improved. Further, replacement of aging measurement devices 6-*i* by new equipment is easier to be planned by a supervisory person. The measurement device to be monitored by the asset management system AMS can be located at the same facility 1 as illustrated in FIG. 1 and communicate with each other via a local area network 2. In a still further possible embodiment, the asset management system AMS according to the present invention can monitor different facilities 1 at different distributed production locations. In this embodiment, a server 4 as illustrated in FIG. 1 can forward the asset tag data via a wide area network WAN such as an internet to a central server monitoring measurement devices 6-*i* at different distributed facilities 1. This server can be located for instance at the manufacturer of the measurement devices 6-*i* using the asset management system AMS.

In the foregoing specification, the invention has been described with reference to specific examples of the embodiments of the invention. It will, however, be evident that various notifications and changes may be made therein without departing from the broader spirit and scope of the present invention as set forth in the appended claims. For example, the connections may be a type of connections suitable to transfer signals from or to the respective nodes, units or devices, for example via intermediate devices. Accordingly, unless implied or stated otherwise, the connections may be for example be direct connections or indirect connections.

For the devices implemented in the present invention are for the most part composed of electronic components and circuits known for those skilled in the art, details of the circuitry and its components will not be explained in any greater extent than that considered necessary as illustrated above, for the understanding and appreciation of the underlying concept of the present invention and in order not to obfuscate or distract from the teachings of the present invention.

Moreover, the present invention is not limited to physical devices or units implemented in non-programmable hardware but can also be applied in programmable devices or units able to perform the desired device functions or operating in accordance with suitable program code. Furthermore, the devices may be physically distributed over a number of apparatuses, or they are functionally operating as a single device. Devices and functions forming separate devices may be integrated in a single physical device.

In the description, any reference signs shall not be construed as limiting the claims. The term "comprising" does not exclude the presence of other elements or steps listed in the claim. Furthermore, the terms "a" or "an" as used herein are defined as one or more than one. Also, the use of introductory phrases such as "at least one" and "one or more" in the claims should not be construed to imply that the introduction of another claim element by the indefinite articles "a" or "an" limiting any particular claim containing such introduced claim element to inventions containing only one such element. The same holds true for the use of definite articles. Unless stated otherwise, terms such as "first" and "second" are used to arbitrarily distinguish between the elements such terms describe. The mere fact that certain measures are recited in different claims does not indicate that a combination of these measures cannot be used to advantage. The order of method steps presented in a claim does not prejudice the order in which the steps can actually be carried out, unless specifically recited in the claim.

The skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well-understood elements that are useful or necessary in a commercial and feasible embodiment are mostly not depicted in order to facilitate a less abstracted view of these various embodiments of the present invention.

The invention claimed is:

1. A high frequency sensitive measurement device comprising:
a measurement circuitry sensitive to high frequency signals and adapted to perform frequency measurements of external circuits;
wherein the measurement circuitry comprises a surrounding high frequency shield adapted to shield the measurement circuitry from external high frequency interference signals,
wherein the high frequency sensitive measurement device comprises at least one inseparable asset tag located outside the high frequency shield and being integrated in a housing of the high frequency sensitive measurement device,
wherein the at least one inseparable asset tag is connected via signal lines to the measurement circuitry,
wherein the signal lines are isolated from the high frequency shield and go through a hole of the high frequency shield,
wherein dynamic asset data is outputted by the at least one inseparable asset tag that indicates a current calibration state of the measurement circuit and comprise local sensor data provided by local sensors of the high frequency sensitive measurement device, and wherein the at least one inseparable asset tag being is configured to communicate with an external interrogator of an asset management system.

2. The high frequency sensitive measurement device according to claim 1, wherein the high frequency sensitive measurement device is configured so that, if the sensor data provided by the local sensors indicate that environmental conditions of the high frequency sensitive measurement device go beyond a predetermined range a corresponding calibration request indicator flag is set in the at least one inseparable asset tag.

3. The high frequency sensitive measurement device according to claim 1, wherein the high frequency sensitive measurement device comprises at least one data interface for connecting the high frequency sensitive measurement device via a data network to a control server and/or an asset management server of a production facility.

4. The high frequency sensitive measurement device according to claim 3, wherein the asset management server is configured to perform an asset management of a plurality of distributed measurement devices on the basis of asset data received from asset tags of the distributed measurement devices.

5. The high frequency sensitive measurement device according to claim 1, wherein the at least one inseparable asset tag of the high frequency sensitive measurement device comprises asset data indicating a current state of the measurement circuitry of the high frequency sensitive measurement device.

6. The high frequency sensitive measurement device according to claim 5, wherein an asset management server of the asset management system is adapted to evaluate current states of a plurality of high frequency sensitive measurement devices on the basis of the received asset data to identify at least a subset of the plurality of high frequency sensitive measurement devices requiring calibration or recalibration of components within the measurement circuitry of each of the high frequency sensitive measurement devices within the subset.

7. The high frequency sensitive measurement device according to claim 1, wherein the high frequency sensitive measurement device comprises an internal operation time measurement unit adapted to measure the operation time of the high frequency sensitive measurement device and to set a calibration request indication flag if the operation time of the high frequency sensitive measurement device exceeds a predetermined threshold value.

8. The high frequency sensitive measurement device according to claim 7, wherein the at least one inseparable asset tag of the high frequency sensitive measurement device is adapted to transmit the calibration request indication flag to the interrogator of the asset management system which supplies the calibration request indication flag along with an identifier of the high frequency sensitive measurement device to an asset management server of the asset management system.

9. The high frequency sensitive measurement device according to claim 8, wherein the identified measurement device to be recalibrated is transported to a calibration apparatus configured to recalibrate the identified measurement device.

10. The high frequency sensitive measurement device according to claim 1, wherein the at least one inseparable asset tag of the high frequency sensitive measurement device comprises an active asset tag and/or a passive asset tag.

11. The high frequency sensitive measurement device according to claim 10, wherein the high frequency sensitive measurement device comprises a short range asset tag and/or a long range asset tag, wherein the long range asset tag of the high frequency sensitive measurement device provides asset data evaluated to locate the high frequency sensitive measurement device in a facility and wherein the short range asset tag of the high frequency sensitive measurement device provides asset data to indicate a current state of the high frequency sensitive measurement device.

12. The high frequency sensitive measurement device according to claim 11, wherein the short range asset tag comprises a near field communication (NFC) tag.

13. The high frequency sensitive measurement device according to claim 11, wherein the long range asset tag comprises a Bluetooth tag.

14. The high frequency sensitive measurement device according to claim 1, wherein the high frequency sensitive measurement device further comprises at least one hidden middle range antitheft tag.

15. The high frequency sensitive measurement device according to claim 1, wherein the ranges of the at least one inseparable asset tag of the high frequency sensitive measurement device are preconfigured or adjusted depending on the physical dimensions of the high frequency sensitive measurement device and/or the respective facility.

16. The high frequency sensitive measurement device according to claim 15, wherein the range of an inseparable short range asset tag is preconfigured or adjusted to:

$$R = \tfrac{1}{2}\mathrm{Min}(W,H,L),$$

wherein W is the width of the housing of the high frequency sensitive measurement device, H is the height of the housing of the high frequency sensitive measurement device, and L is the length of the housing of the high frequency sensitive measurement device, so that R equals one half of a minimum value of one among W, H, and L.

17. The high frequency sensitive measurement device according to claim 1, wherein the at least one inseparable asset tag comprises a write memory to which configuration data can be written by the interrogator of the asset management system.

18. The high frequency sensitive measurement device according to claim 1, wherein the at least one inseparable asset tag comprises a proximity detection unit configured to detect the presence of the external interrogator of the asset management system in the vicinity of the at least one inseparable asset tag and to push automatically asset data from the at least one inseparable asset tag to the external interrogator if the external interrogator is within the range of the at least one inseparable asset tag.

19. The high frequency sensitive measurement device according to claim 1, wherein the measurement circuitry of the high frequency sensitive measurement device comprises high frequency components sensitive to external high frequency signals shielded by the surrounding high frequency shield.

20. An asset management system comprising an asset management server connected to a plurality of distributed high frequency (HF) sensitive measurement devices each HF sensitive measurement device having comprising:
  a measurement circuitry sensitive to high frequency signals and adapted to perform frequency measurements of external circuits,
  wherein the measurement circuitry has a surrounding high frequency shield adapted to shield the measurement circuitry from external high frequency (HF) interference signals, at least one inseparable asset tag being located outside the high frequency shield and being integrated in a housing of the HF sensitive measurement device,
  wherein the inseparable asset tag is connected via signal lines to the measurement circuitry, wherein the signal lines are isolated from the high frequency shield and go through a hole of the high frequency shield,
  wherein the inseparable asset tag is adapted to provide static asset data and dynamic asset data, wherein the dynamic asset data indicate a current calibration state of the measurement circuitry and comprise local sensor data provided by local sensors of the high frequency (HF) sensitive measurement device, said inseparable asset tag being configured to communicate with an external interrogator of an asset management system.

21. The asset management system according to claim 20, wherein each HF sensitive measurement device comprises at least one inseparable short range asset tag and/or an inseparable long range asset tag read by the external interrogator switchable between at least two operation modes, wherein the external interrogator is configured to read in a first operation mode first asset data from the inseparable long range asset tags attached to the distributed HF sensitive measurement devices and is configured to read in a second operation mode second asset data from the inseparable short range asset tags attached to the distributed HF sensitive measurement devices.

* * * * *